United States Patent
Dey et al.

(10) Patent No.: US 11,169,590 B2
(45) Date of Patent: Nov. 9, 2021

(54) CORE RAMP DETECTION CIRCUITRY

(71) Applicant: Arm Limited, Cambridge (GB)

(72) Inventors: Ranabir Dey, Bangalore (IN); Vinay Chenani, Bangalore (IN); Kundan Srivastava, Bangalore (IN); Vijaya Kumar Vinukonda, Bangalore (IN)

(73) Assignee: Arm Limited, Cambridge (GB)

( * ) Notice: Subject to any disclaimer, the term of this patent is extended or adjusted under 35 U.S.C. 154(b) by 81 days.

(21) Appl. No.: 16/517,216

(22) Filed: Jul. 19, 2019

(65) Prior Publication Data

US 2021/0018974 A1  Jan. 21, 2021

(51) Int. Cl.
| G06F 1/00 | (2006.01) |
| G06F 1/3234 | (2019.01) |
| G06F 1/3225 | (2019.01) |
| G06F 1/3203 | (2019.01) |

(52) U.S. Cl.
CPC .......... G06F 1/3278 (2013.01); G06F 1/3225 (2013.01); G06F 1/3203 (2013.01)

(58) Field of Classification Search
CPC .............................. G06F 1/3278; G06F 1/3225
USPC ......................................................... 713/300
See application file for complete search history.

(56) References Cited

U.S. PATENT DOCUMENTS

| 9,509,308 B2* | 11/2016 | Lim ........................ G06F 3/0443 |
| 10,263,619 B1* | 4/2019 | Wang ..................... G06F 1/3287 |
| 2006/0059376 A1* | 3/2006 | Ngo ........................ G06F 1/3228 |
| | | 713/300 |
| 2009/0027102 A1* | 1/2009 | Fayed ..................... H03K 3/012 |
| | | 327/333 |
| 2009/0085610 A1* | 4/2009 | Westwick ................ H03K 5/24 |
| | | 327/68 |
| 2009/0160544 A1* | 6/2009 | Otsuga ............... H03K 19/0016 |
| | | 327/564 |
| 2010/0153759 A1* | 6/2010 | Singhal .................. G06F 1/3287 |
| | | 713/322 |
| 2010/0313003 A1* | 12/2010 | Breton ....................... G06F 1/30 |
| | | 713/1 |
| 2011/0095804 A1* | 4/2011 | Kumar ........... H03K 19/018521 |
| | | 327/333 |
| 2011/0276812 A1* | 11/2011 | Lee ........................... G06F 1/26 |
| | | 713/300 |
| 2012/0153994 A1* | 6/2012 | Kwon ....................... G06F 1/26 |
| | | 327/97 |
| 2013/0044397 A1* | 2/2013 | Tsai ........................ H02H 9/046 |
| | | 361/56 |

(Continued)

OTHER PUBLICATIONS

Delp, et al.; Design and Verification of Low Power SoCs; ISQED09; Mar. 18, 2009.

(Continued)

*Primary Examiner* — Volvick Derose
(74) *Attorney, Agent, or Firm* — Pramudji Law Group PLLC; Ari Pramudji

(57) ABSTRACT

Various implementations described herein are directed to a device having an output pad that provides an input-output (IO) voltage from an IO power supply. The device may include core ramp detection circuitry that detects a first ramp of a core voltage from a core power supply and provides a core ramp sensing signal. The device may include output logic circuitry that couples the output pad to ground after receiving the core ramp sensing signal so as to reduce leakage of the IO power supply.

21 Claims, 11 Drawing Sheets

(56) References Cited

U.S. PATENT DOCUMENTS

| | | | |
|---|---|---|---|
| 2015/0076908 A1* | 3/2015 | Bose | H02J 1/00 |
| | | | 307/39 |
| 2016/0239060 A1* | 8/2016 | Koob | G06F 1/3287 |
| 2016/0363985 A1* | 12/2016 | Ehmann | G06F 13/37 |
| 2018/0174643 A1* | 6/2018 | Cheng | H01L 23/5286 |
| 2019/0150095 A1* | 5/2019 | Lin | H04W 52/0267 |
| | | | 370/311 |
| 2020/0153241 A1* | 5/2020 | Mathur | H02H 9/046 |

OTHER PUBLICATIONS

Aris, et al.; Dynamic and Leakage Power Reduction in MTCMOS Circuits Using an Automated Efficient Grate Clustering Technique; 39th annual Design Automation Conference (DAC '02); pp. 480-485; Jun. 2002.

Rush; Power Supply Sequencing for Low Voltage Processors; EDN; Sep. 2000.

* cited by examiner

CORE RAMP DETECTION CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Some conventional circuit designs seek to operate with low power. To enable low power schemes, input/output (IO) circuitry may be adapted to support multiple power domains. However, using multiple power domains typically results into power sequencing of these multi domains, wherein power sequencing refers to a strategy by which the order or sequence of ramping-up or ramping-down of multiple power supplies are determined. Also, improper power sequencing may lead to unnecessary leakage from IO circuitry and/or result in an undefined state at the output. As such, there exists a need to reduce leakage so as to improve circuit performance and efficiency.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to core ramp detection circuitry including schemes and techniques for improving leakage efficiency in reference to input/output (IO) circuitry for various low power applications. The various schemes and techniques described herein may provide for an innovative approach to effectively reduce or minimize leakage current due to independent power sequencing (i.e., order of ramping-up or ramping-down of multiple supplies) of different power domains in low power application specific system-on-a-chip (SoC). For instance, the various schemes and techniques described herein may provide for integrated circuitry (IC) to avoid false or undefined logic states during powering-up or powering-down of multiple power domains and also to avoid the unnecessary leakage current from power supplies by defining a stable state at the output during power sequencing operation.

Various implementations described herein support power sequencing with use of a PVSense cell as part of a power management solution. The PVSense cell detects availability of both core and IO supplies and either tri-states or retains the output of PBID-TX to some predefined value based on various parameters of core circuitry. For instance, when a first IO cell operating in a first voltage domain drives a second IO cell operating in a second voltage domain, then an output of the first IO cell retains a predefined value (0 or 1) during powering-off of the first voltage domain. This technique may ensure that the second IO cell has a stable power supply that does not leak due to an undefined state at its input, and the output of the second IO cell may have a definite state instead of the undefined state. This retention process may work well when there is some previous data at a first input-output (IO) cell to retain, but retention may not hold valid if there was no valid previous data available (e.g., during first time ramping-up of core voltage). When core circuitry begins ramping-up for the first time, then output of the first IO cell may be undefined, and in that condition, the retention operation may cause an undefined state at the output of first IO cell. Therefore, various schemes and techniques described herein seek to resolve problems associated with the first ramp by detecting a first core ramp operation. When the first-time ramp of the core is detected, the various schemes and techniques described herein enable weak pulldown logic circuitry (until core supply starts first time ramping-up) provided in the first IO cell. Thus, by enabling weak pulldown logic, the state at an output may be grounded and thus make logic zero instead of keeping the output pad in an undefined state at floating (X), and as such, supply leakage through the second IO cell may be avoided.

Various implementations of core ramp detection circuitry will be described in detail herein with reference to FIGS. 1A-5B.

Figure 1A:
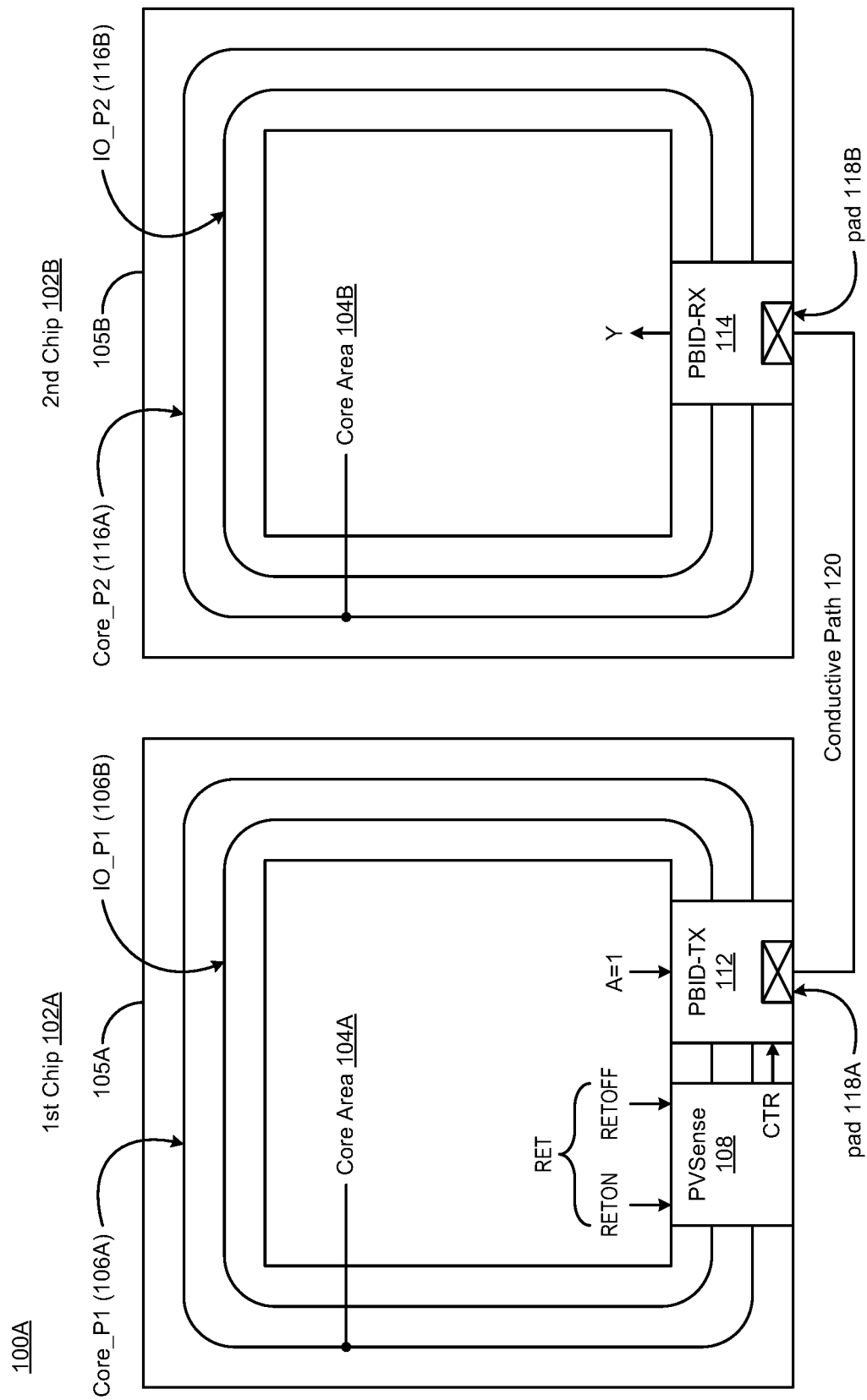
FIG. 1A illustrates a diagram of multiple chips, core circuitry and input-output (IO) circuitry in accordance with various implementations described herein.

FIG. 1A illustrates a diagram of multiple chips and core circuitry 100A in accordance with various implementations described herein. In some instances, the core circuitry 100A may be implemented as a system or device having various circuit components that are arranged and coupled together as an assemblage or combination of parts that provide for a system in a package or board type structure. Also, in some instances, a method of detecting core ramp may involve use of the various circuit components described herein to implement improved performance schemes and techniques.

As shown in FIG. 1A, the core circuitry 100A may include various components including one or more semiconductor chips (or dies), such as, e.g., a first chip (or die) 102A and a second chip (or die) 102B, that are coupled together via a conductive path 120. In various instances, the conductive path 120 may be formed with a conductive wire or similar. Further description related to the core circuitry 100A and various components associated therewith are described in greater detail herein below.

The core circuitry 100A may be implemented as one or more integrated circuits (ICs) using various types of memory, such as random access memory (RAM), including static RAM (SRAM), and/or any other types of volatile memory and other logic circuits. In some instances, each of the dies 102A, 102B of the core circuitry 100A may be implemented as an IC with memory architecture and related circuitry. In other instances, each of the dies 102A, 102B the core circuitry 100A may be integrated with various types of computing circuitry and related components on a single chip. Also, each of the dies 102A, 102B of the core circuitry 100A may be implemented in various embedded systems for various electronic, mobile and Internet-of-things (IoT) applications, including low power sensor nodes.

As shown in FIG. 1A, the first chip 102A may have a sensing circuit (PVSense 108) and a first input/output (IO) cell (PBID-TX 112) with a first output pad 118A that may be adapted to provide an input-output (IO) signal. The sensing circuit (PVSense 108) may be configured to receive a retention signal (e.g., RET: RETON/RETOFF) from a first core area 104A and provide a core ramp sensing signal (CTR) to the first IO cell (PBID-TX 112) based on the retention signal (e.g., RET: RETON/RETOFF). In some instances, the first IO cell (PBID-TX 112) may receive a core data input signal (A) from the first core area 104A, and the core data input signal (A) may have a logical value of one (e.g., A=1) that assists with activation of the first IO cell (PBID-TX 112). In some implementations, the retention signal (RET) refers to an input signal to the sensing circuit (PVSense 108), the core ramp sensing signal (CTR) refers to an output of the sensing circuit (PVSense 108), and the CTR signal may refer to a combination of the SNS signal and the RTO signal.

As also shown in FIG. 1A, the second chip 102B may have a second IO cell (PBID_RX 114) with a second output pad 118B that receives the IO signal from the first output pad 118A. In some instances, the second IO cell (PBID-RX 114) may provide core data output signal (Y) to a second core area 104B.

In some implementations, the sensing circuit (PVSense 108) may be configured to detect a first ramp of the core voltage (Core_P1) and then couple the first output pad 118A to ground (Gnd or Vss) until the core supply (Core_P1) starts first time ramping-up to thereby reduce leakage of the core voltage (Core_P1/Core_P2) and/or the IO voltage (IO_P1/IO_P2) to the second output pad 118B. In some instances, the first IO cell (PBID-TX 112) may be adapted to transmit (TX) the IO signal to the second chip 102B via the conductive path 120, and the second IO cell (PBID_RX 114) may be adapted to receive (RX) the IO signal from the first IO cell (PBID-TX 112) via the conductive path 120.

In reference to FIG. 1A, the first chip 102A and the second chip 102B may be separately implemented with various functional components adapted to perform various operations. For instance, as shown, the first chip 102A may be a device that provides the core voltage (Core_P1) on a first power supply bus 106A (core power supply), and the first chip 102A may provide the IO voltage (IO_P1) on a second power supply bus 106B (IO power supply). Thus, the first chip 102A may operate with multiple voltage domains, including, e.g., the core voltage (Core_P1) on the first bus 106A (core power supply) and the (IO) voltage (IO_P1) on the second bus 106B (IO voltage supply). The first chip 102A may include the sensing circuit (PVSense 108) that detects a first ramp of the core voltage (Core_P1) and provides the core ramp sensing signal (CTR) to output logic of the first IO cell (PBID-TX 112). In some cases, the first chip 102A may include the first IO cell (PBID-TX 112) that couples the first output pad 118A to ground (Gnd or Vss) after receiving the core ramp sensing signal (CTR) to reduce leakage of the core voltage (Core_P1) and/or the IO voltage (IO_P1). Also, the first IO cell (PBID-TX 112) may transmit (TX) the IO voltage (IO_P1) to the second chip 102B via the conductive path 120.

In some instances, the core voltage (Core_P1) on the first bus 106A may refer to a core voltage domain (Vdd), and the IO voltage (IO_P1) on the second bus 106B may refer to an IO voltage domain (DVdd). Also, the core voltage domain (Vdd) may be related to a corresponding core reference (Gnd or Vss), and the IO voltage domain (DVdd) may be related to a corresponding IO reference (DVss). Also, in some instances, a core voltage supply provides the core voltage (Core_P1) via the first bus 106A, and an IO voltage supply provides the IO voltage (IO_P1) via the second bus 106B.

The second chip 102B may also be a device having the second output pad 118B as a structure that provides another core voltage (Core_P2) on a first bus 116A (core power supply), and the second chip 102B may provide another IO voltage (IO_P2) on a second bus 116B (IO power supply). Thus, the second chip 102B may also operate with multiple voltage domains, including, e.g., the core voltage (Core_P2) on the first bus 116A (core voltage supply) and the IO voltage (IO_P2) on the second bus 116B (IO power supply). The second chip 102B may include output logic in the second IO cell (PBID_RX 114), and as such, the second chip 102B may include the second IO cell (PBID_RX 114) that may be adapted to receive (RX) the IO signal from the first chip 102A via the conductive path 120.

In some implementations, the first IO cell (PBID-TX 112) and the second IO cell (PBID_RX 114) may be referred to as bi-directional IO cells. Also, the first bus 116A may be referred to as a core voltage ring that is coupled to a core power supply, and the second bus 116B may be referred to as an IO voltage ring that is coupled to an IO power supply. Also, the sensing circuit (PVSense 108) may be referred to as a power management cell that may be used for reducing unwanted current associated with of the core voltage ring and the IO voltage ring during power sequencing. Also, in some instances, the core voltage (Core_P1) refers to the core voltage supply in the P1 domain, and the IO voltage (IO_P1) refers to the IO voltage supply in the P1 domain. The core voltage (Core_P2) refers to the core voltage supply in the P2 domain, and the IO voltage (IO_P2) refers to the IO voltage supply in the P2 domain. Generally, a mark of (X) may refer to an undefined state.

As shown in FIG. 1A, the first chip 102A may include a core area 104A that is coupled to the core voltage (Core_P1) via the first bus 106A. Also, the first chip 102A may include a periphery area 105A that is coupled to the IO voltage (IO_P1) via the second bus 106B. The periphery area 105A may include one or more IO ports that operate with the IO voltage (IO_P1). Also, as shown in FIG. 1A, the second chip 102B may include a core area 104B that is coupled to the core voltage (Core_P2) via the first bus 116A, and the second chip 102B may include a periphery area 105B that is coupled to the IO voltage (IO_P2) via the second bus 116B. The periphery area 105B may include one or more IO ports that operate with the IO voltage (IO_P2).

In some instances, the output pad structures 118A, 118B may be referred to as shared bus structures (or PAD structures) that may be shared by multiple devices, such as e.g., the first chip 102A and the second chip 102B. Also, the first buses 106A, 116A (or core voltage buses or rings) provide the corresponding core voltages (Core_P1, Core_P2) in the core voltage domain (Vdd). The first output pad 118A is coupled to the core voltage bus 106A via the first IO cell (PBID-TX 112), and the second output pad 118B is coupled to the core voltage bus 116A via the second IO cell (PBID-RX 114). The second buses 106B, 116B (or IO voltage buses or rings) provide corresponding IO voltages (IO_P1, IO_P2) in an IO voltage domain (DVdd) that is different than the core voltage domain (Vdd). The first output pad 118A may be coupled to the IO voltage bus 106B via the first IO cell (PBID-TX 112), and the second output pad 118B may also be coupled to the IO voltage bus 116B via the second IO cell (PBID-RX 114). Also, a core voltage supply provides the core voltage (Core_P2) via the first bus 116A, and an IO voltage supply provides the IO voltage (IO_P2) via the second bus 116B.

Advantageously, the core circuitry 100A (or device/system) may inhibit leakage of the core voltage (Core_P1) and/or the IO voltage (IO_P1) due to independent power sequencing of the core voltage (Core_P1) and the IO voltage (IO_P1) in some low power applications. Also, in some cases, the core circuitry 100A (or device/system) may similarly inhibit leakage of the other core voltage (Core_P2) and/or the other IO voltage (IO_P1) due to independent power sequencing of the other core voltage (Core_P1) and the other IO voltage (IO_P1) in some similar low power applications.

In accordance with various implementations described herein, the memory type structures may include core array circuitry having an array of memory cells, wherein each memory cell may be referred to as a bitcell. Also, each memory cell may be configured to store at least one data bit value (e.g., data value related to a logical '0' or '1'). In various instances, the array of memory cells may include any number of memory cells (or bitcells) that are arranged in various applicable configurations, such as, e.g., a two-dimensional (2D) memory array having any number of columns (Ncolumns) and any number of rows (Nrows) of multiple memory cells arranged in a 2D grid pattern. In various instances, any type of core circuitry may be used, including, e.g., standard cells, memory cells, flip-flops, latches, level shifters, etc.

Figure 1B:
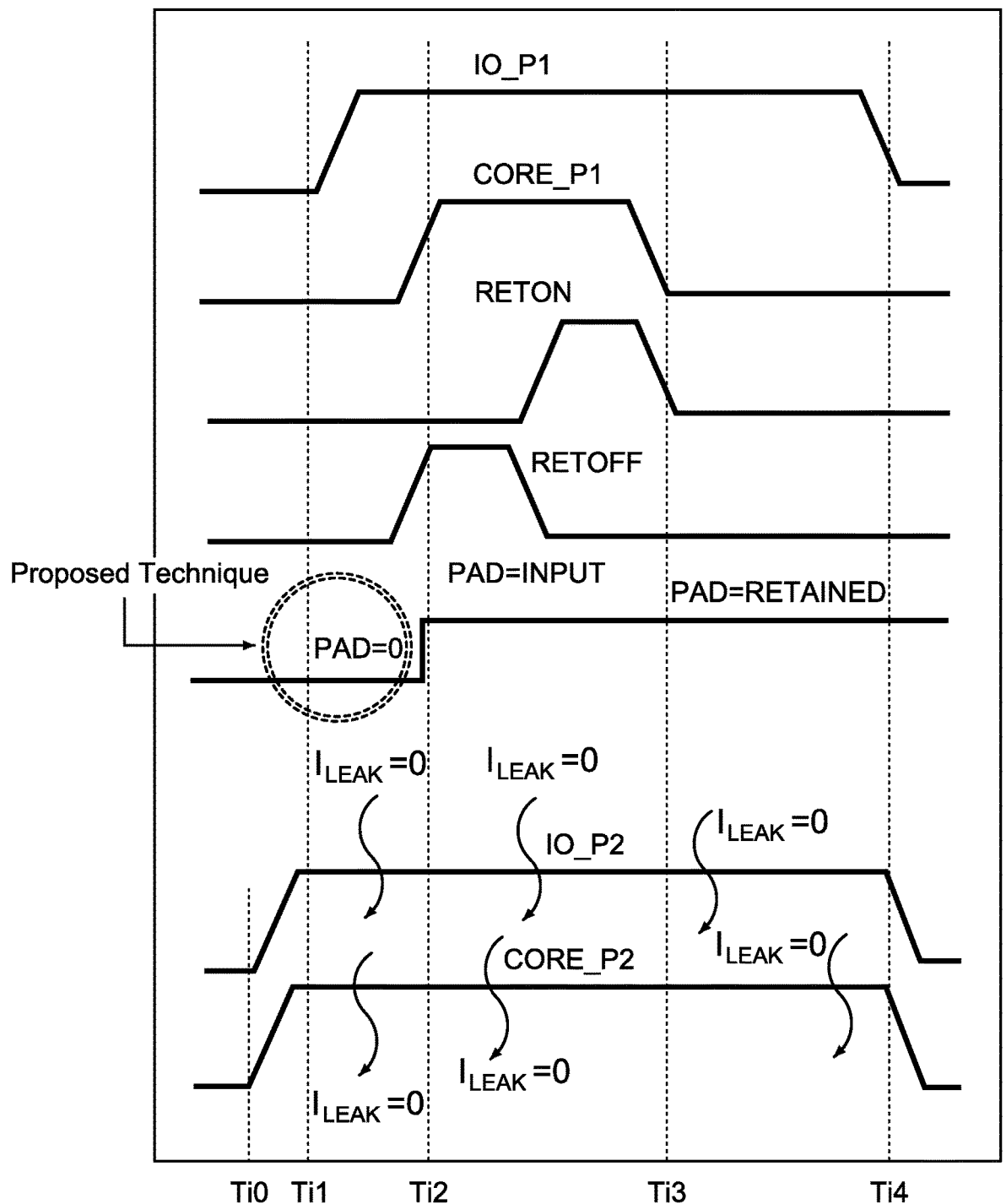
FIG. 1B illustrates a waveform diagram of power sequencing in accordance with various implementations described herein.

FIG. 1B illustrates a waveform diagram 100B of power sequence timing 102C in accordance with various implementations described herein.

In FIG. 1B, the waveform diagram 100B shows the power sequence timing 102C of multiple signals, including IO_P1, Core_P1, RETON, RETOFF, and PAD along with IO_P2 and Core_P2. Between time Ti0 and Ti1, the signals (IO_P1, Core_P1, RETON, RETOFF, and PAD) are at zero volts (0V). At time Ti1, the IO_P1 signal begins ramping, and then just before time Ti2, the Core_P1 signal begins ramping. During this ramping of the signals (IO_P1, Core_P1) between times Ti0 and Ti1, the PAD voltage maintains a zero voltage (0V) state. In this instance, leakage of IO_P2 and Core_P2 goes to zero. Also, during times Ti1-Ti2, the PAD maintains a zero voltage state (0V). At time Ti2, as the Core_P1 signal begins ramping and as the RETOFF signal begins ramping, the PAD rises to a logic one state (logic 1), and at times greater than Ti2, the PAD voltage may be retained at the logic one state (logic 1).

In reference to the PVSense cell 108 of FIG. 1A, operation of the PVSense cell 108 during power sequencing 102C is shown in FIG. 1B. During times Ti1-Ti2, the PVSense cell 108 detects the first ramp condition of Core_P1 and enables the PBID-TX cell 112 to weakly pulldown the PAD 118A to a logic zero state (logic 0) until core supply (Core_P1) starts ramping-up for the first time. As a result, the leakage through the PBID-RX cell 114 may be avoided. Further, once the core power is ramped-up during times Ti2-Ti4, then core ramp detection may be automatically disabled, and also, normal PVSense cell 108 operation follows for subsequent power ramps.

In some implementations, various schemes and techniques described herein address the core ramp leakage issue. The unique PVSense circuit 108 detects the initial or first core ramp condition that happens in the IO voltage ring, and until core supply (Core_P1) starts ramping-up for the first time, the PVSense circuit 108 outputs SNS=0, RTO=0 (in reference to the reserved state) to the first IO cell 112. As described herein, the first IO cell 112 is designed in such a way that when the input SNS/RTO=00 is received at its input, then the first IO cell 112 enables the weak pulldown logic circuitry so as to couple the output pad 118A to ground (Gnd/Vss=0V) instead of keeping the output pad 118A in a floating state or an undefined (X) state. In some instances, the first IO cell 112 may be backward compatible, in a sense that the first IO cell 112 may be used with existing circuit designs, because the existing circuit designs may not be able to generate the SNS/RTO=00 condition.

Figure 2A:
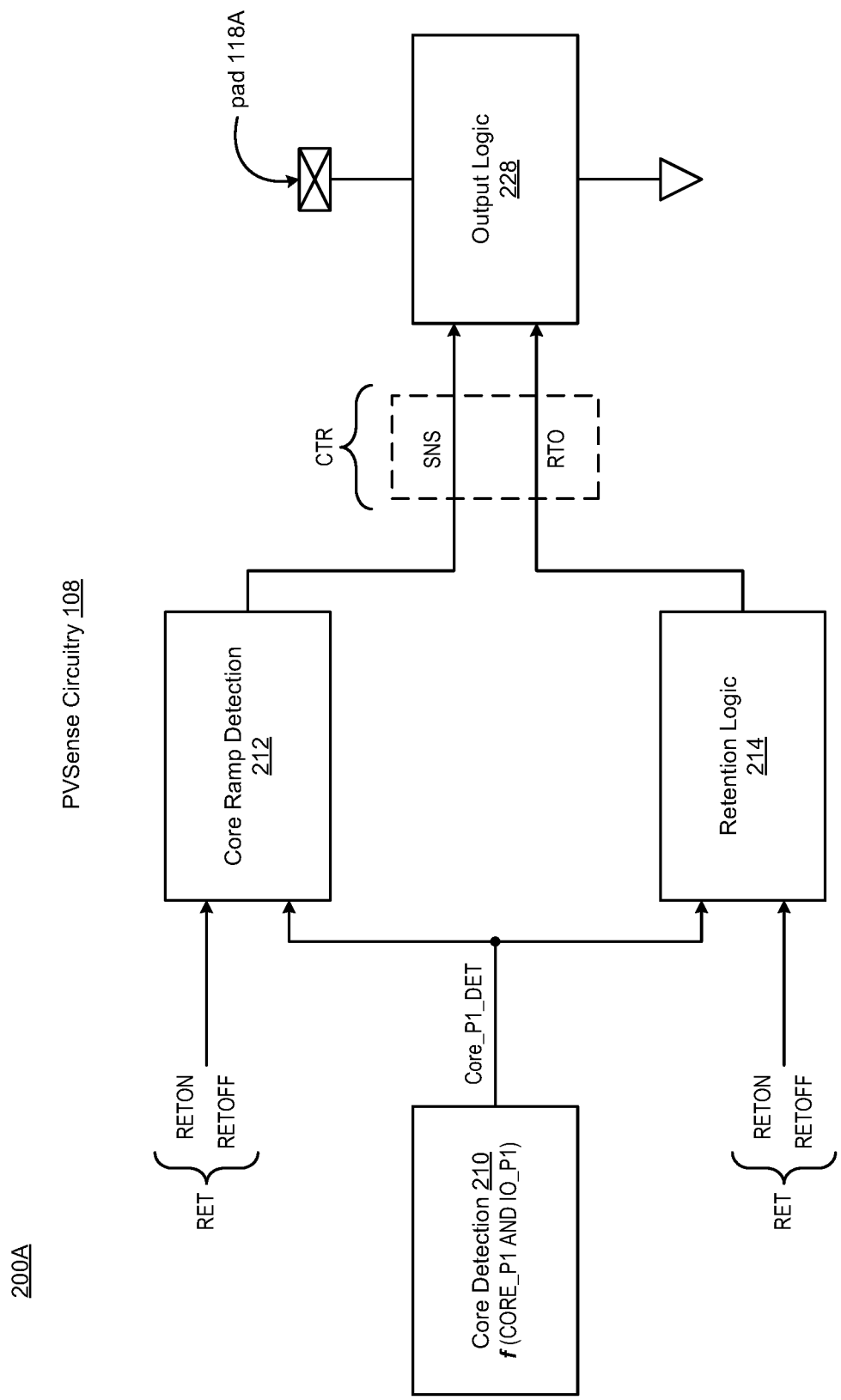
FIGS. 2A-2D illustrate diagrams of circuitry related to core ramp detection in accordance with various implementations described herein.
Figure 2B:
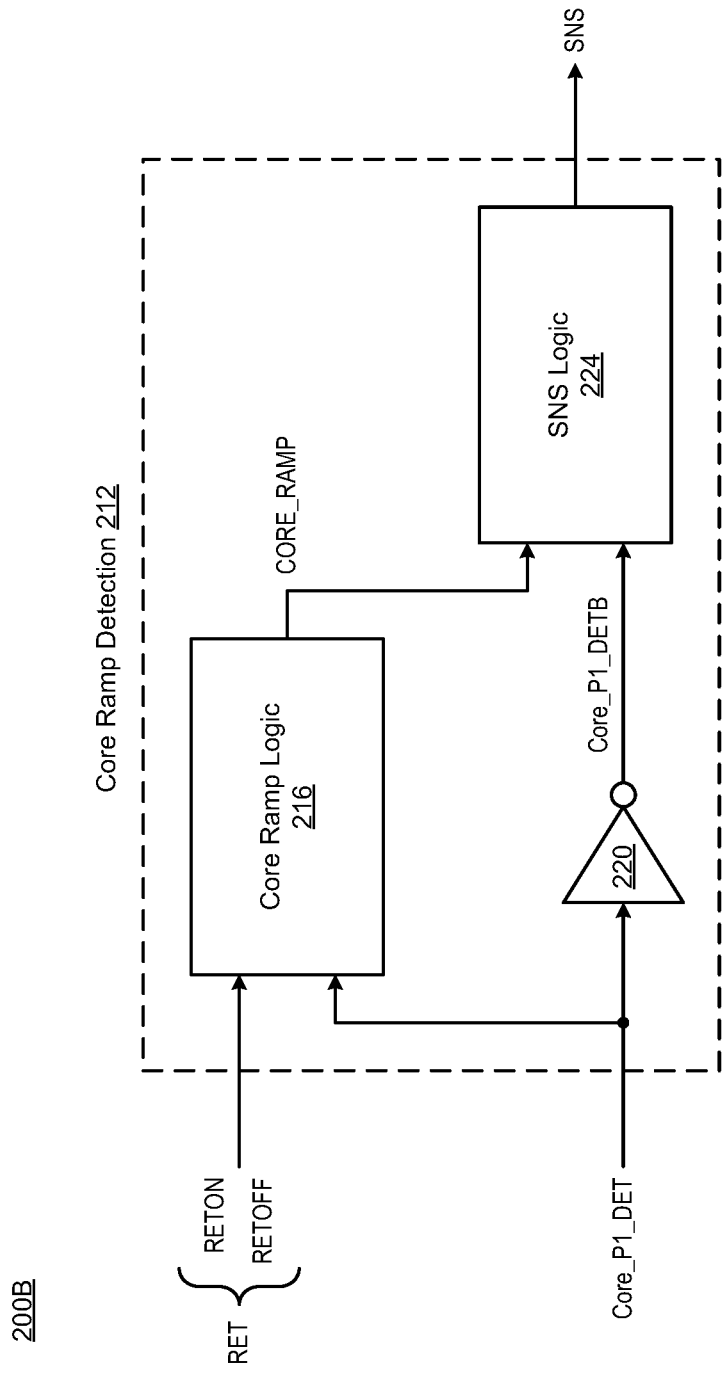
Figure 2C:
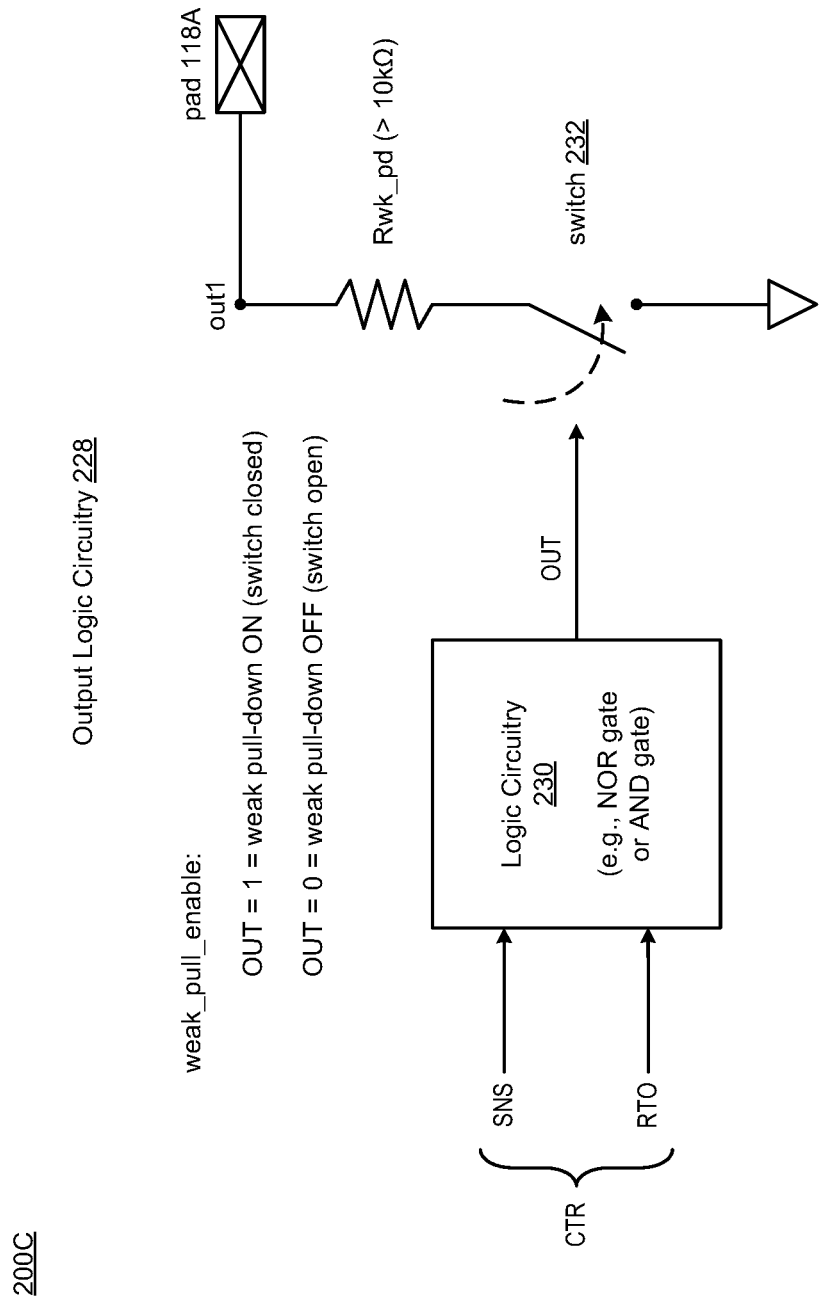
Figure 2D:
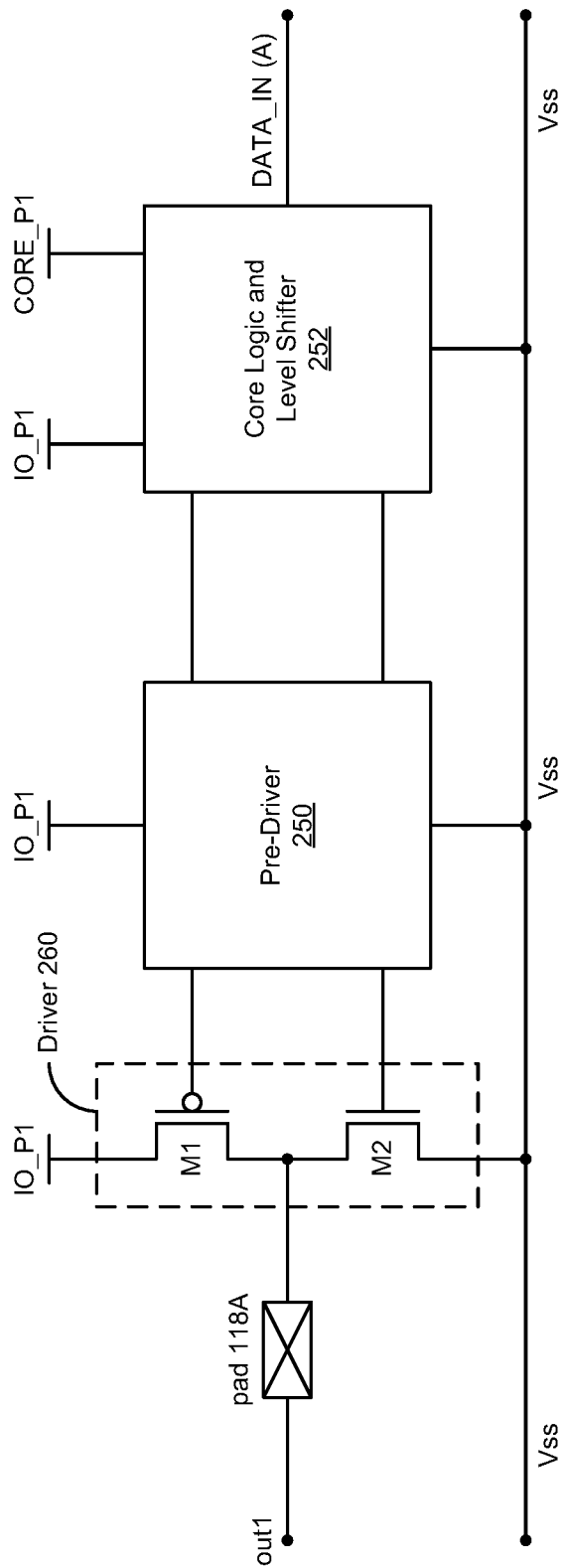

FIGS. 2A-2D illustrate diagrams of circuitry related to core ramp detection in accordance with some implementations described herein. In particular, FIG. 2A shows a diagram of sensing circuitry 200A, FIG. 2B shows a diagram of core ramp detection circuitry 200B, FIG. 2C shows a diagram of output logic circuitry 200C, and FIG. 2D shows a diagram of another part of output logic circuitry 200D.

In reference to FIG. 2A, the sensing circuitry 200A refers to the sensing circuit (PVSense 108) of FIG. 1A. In some implementations, the sensing circuitry 200A may be implemented as a system or device having various circuit components (or blocks) that are arranged and coupled together as an assemblage or some combination of parts that provide for core ramp detection. Also, a method of core ramp detection may involve use of various circuit components that are described herein to so as to implement improved performance schemes and techniques.

As shown in FIG. 2A, the sensing circuitry 200A (PVSense 108) may include various components including core detection circuitry 210, core ramp detection circuitry 212, retention logic circuitry 214, and output logic circuitry 228. In some instances, the output logic circuitry 228 may refer to a weak pull-up of the first IO cell (PBID_TX 112) of FIG. 1A.

The sensing circuitry 200A (PVSense 108) may include an output pad structure 118A that provides an IO signal. The core ramp detection circuitry 212 may detect ramp of the core voltage (Core_P1) and provide a core ramp sensing signal (CTR, or part thereof, such as, e.g., SNS). The output logic circuitry 228 may couple the output pad structure 118A to ground (Gnd or Vss) after receiving the core ramp sensing signal (CTR: SNS) to reduce leakage of the core voltage (Core_P1) and/or the IO voltage (IO_P1). In some instances, the core ramp detection circuitry 212 may be referred to as first core ramp detection circuitry that operates to avoid leakage on the core voltage (Core_P1) and/or the IO voltage (IO_P1) during a first core power ramp-up.

The core detection circuitry 210 may sense the core voltage (Core_P1) and provide a core detection signal (Core_P1_DET) to the core ramp detection circuitry 212. In some instances, the core ramp detection circuitry 212 may receive the core detection signal (Core_P1_DET) from the core detection 210, receive a retention signal (RET: RETON/RETOFF), and provide the core ramp sensing signal (CTR: SNS) to the output logic circuitry 228 based on the core detection signal (Core_P1_DET) and/or the retention signal (RET: RETON/RETOFF).

The retention logic circuitry 214 may receive the core detection signal (Core_P1_DET) from the core detection circuitry 210, receive the retention signal (RET: RETON/RETOFF), and provide an output retention signal (RTO) to the output logic circuitry 228. In some instances, the output retention signal (RTO) may be part of the core ramp sensing signal (CTR). As such, the CTR signal may include the SNS signal and/or the RTO signal. The output logic circuitry 228 may receive the core ramp sensing signal (CTR: SNS) from the core ramp detection circuitry 212, receive the output retention signal (CTR: RTO) from the retention logic circuitry 214, and couple the output pad structure 118A to ground (Gnd or Vss) after receiving the core ramp sensing signal (CTR: SNS) and after receiving the output retention signal (CTR: RTO) so as to thereby reduce leakage of the core voltage (Core_P1) and/or the IO voltage (IO_P1).

The output logic circuitry 228 may couple the output pad structure 118A to ground (Gnd or Vss) after receiving the core ramp sensing signal (CTR: SNS) in a logic zero state (logic 0) and after receiving the output retention signal (CTR: RTO) in the logic zero state (logic 0) to thereby reduce leakage of the core voltage (Core_P1) and/or the IO voltage (IO_P1).

In reference to FIG. 2B, the core ramp detection circuitry 200B refers to the core ramp detection circuitry 212 of FIG. 2A. As shown in FIG. 2B, the core ramp detection circuitry 212 may include various components including core ramp logic circuitry 216, inverter circuitry 220, and sense (SNS) logic circuitry 224.

As shown in FIG. 2B, the core ramp detection circuitry 212 may include the core ramp logic circuitry 216 that receives the core detection signal (Core_P1_DET) from the core detection circuitry 210 (of FIG. 2A), receives the retention signal (RET: RETON/RETOFF), and provides a core ramp signal (CORE_RAMP) to the sense (SNS) logic circuitry 224. Also, the core ramp detection circuitry 212 may include the inverter circuitry 220 that receives the core detection signal (Core_P1_DET) from the core detection circuitry 210 (of FIG. 2A) and provides an inverted core detection signal (Core_P1_DETB). Also, the core ramp detection circuitry 212 may include the sense (SNS) logic circuitry 224 that receives the core ramp signal (CORE_RAMP) from the core ramp logic circuitry 216, receives the inverted core detection signal (Core_P1_DETB) from the inverter circuitry 220, and provides the core ramp sensing signal (SNS) to the output logic circuitry 228 (of FIG. 2A).

In reference to FIG. 2C, the output logic circuitry 200C refers to the output logic circuitry 228 of FIG. 2C. As shown in FIG. 2C, the output logic circuitry 228 may include various components including NOR logic circuitry 230 and switch 232.

As shown in FIG. 2C, the output logic circuitry 228 may be implemented as weak pulldown circuitry having a logic gate (e.g., NOR logic circuitry 230) that receives the core ramp sensing signal (SNS) from the core ramp detection circuitry 212 (of FIG. 2A), receives the output retention signal (RTO) from the retention logic circuitry 214 (of FIG. 2A), and provides an activation signal (OUT). In some instances, the activation signal (OUT) may be used to activate the switch 232 that couples the output pad structure 118A to ground (Gnd or Vss) after receiving the core ramp sensing signal (SNS) in a first logic state (e.g., logic zero state) and after receiving the output retention signal (RTO) in a second logic state (e.g., logic zero state).

The switch 232 may be coupled between the output pad structure 118A and ground (Gnd or Vss) at node (out1). In some instances, the output pad structure 118A may have a weak pulldown resistance (Rwk_pd) of at least greater than 10 kΩ (i.e., Rwk_pd>10 kΩ). Also, the output pad structure 118A may be used to provide an output IO signal.

In some implementations, the activation signal (OUT) may be referred to as a weak_pull_enable signal that may provide a logic one state (logic 1) or a logic zero state (logic 0) to the switch 232. For instance, a weak_pull_enable signal having the logic one state (OUT=1) may provide for a closed switch 232 in reference to an active weak pulldown in an ON state. Also, in this instance, a weak_pull_enable signal having the logic zero state (OUT=0) may provide for an open switch 232 in reference to an active weak pulldown in an OFF state.

In reference to FIG. 2D, the output logic circuitry 200D refers to an output logic circuitry 248 that may be coupled to the output weak-pull logic circuitry 228 of FIG. 2C at output pad structure 118A. As shown in FIG. 2D, the output logic circuitry 248 may include various components including transistors (M1, M2), pre-driver circuitry 250, and core logic and level shifter circuitry 252.

As shown in FIG. 2D, the transistors (M1, M2 may be coupled between the IO voltage (IO_P1) and ground (Vss). The output pad structure 118A may be coupled between node (out1) and the transistors (M1, M2). In some instances, the transistor (M1) may be a PMOS transistor, and the transistor (T2) may be an NMOS transistor. Also, the pre-driver circuitry 250 may be coupled between the IO voltage (IO_P1) and ground (Vss), and the pre-driver circuitry 250 may be coupled to gates of the transistors (M1, M2). Also, the core logic and level shifter circuitry 252 may be coupled between the IO voltage (IO_P1) and ground (Vss), and the core logic and level shifter circuitry 252 may be coupled to the pre-driver circuitry 250. Also, the core logic and level shifter circuitry 252 may be coupled between the core voltage (Core_P1) and ground (Vss). The core logic and level shifter circuitry 252 may receive a data input signal (DATA_IN) and provide a level shifted data input signal to the pre-driver circuitry 250.

Figure 3:
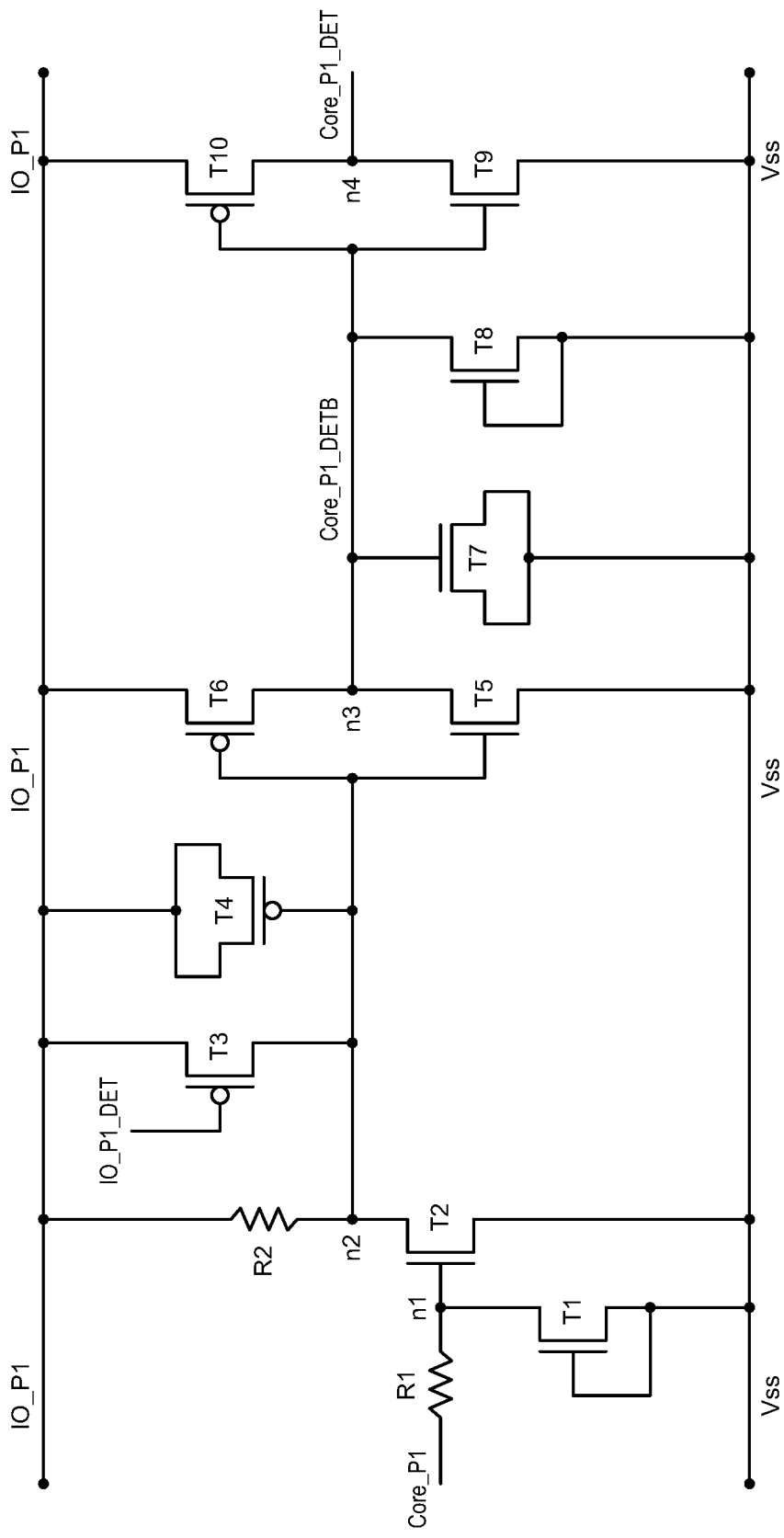
FIG. 3 illustrates a diagram of core detection circuitry in accordance with various implementations described herein.

FIG. 3 illustrates a diagram of core detection circuitry 300 in accordance with various implementations described herein.

As shown in FIG. 3, the core detection circuitry 300 may include one or more transistors (T1-T2, . . . , T10) and one or more resistors (R1, R2) that are arranged and coupled together to receive input signals (Core_P1, IO_P1_DET) and provide an output signal (Core_P1_DET, Core_P1_DETB).

In FIG. 3, a resistor (R1) may be coupled between an input node (Core_P1) and a gate of transistor (T2) at node (n1), and transistor (T1) may be coupled between the gate of transistor (T2) at node (n1) and ground (Gnd or Vss). The transistor (T1) may be coupled as a gate-grounded NMOS transistor. Also, a resistor (R2) may be coupled between a voltage supply (Vdd) and transistor (T2) at node (n2), and transistor (T2) may be coupled between the resistor (R2) at node (n2) and ground (Gnd or Vss). Transistor (T3) may be coupled between the voltage supply (Vdd) and node (n2), and the input signal (IO_P1) may be coupled to a gate of transistor (T3). Transistor (T4) may have its source and drain coupled together to the voltage supply (Vdd), and node (n2) may be coupled to a gate of transistor (T4). Transistors (T5, T6) may be coupled as an inverter between the voltage supply (Vdd) and ground (Gnd or Vss). Also, node (n2) may be coupled to gates of transistors (T5, T6), and node (n3) may be coupled between transistors (T5, T6). In some instances, node (n3) may have a node voltage (Core_P1_DETB), which may be referred to as the inverted core detection signal for core voltage (Core_P1). Transistor (T7) may have its source and drain coupled together to ground (Gnd or Vss), and node (n3) may be coupled to a gate of transistor (T7). Transistor (T8) may be coupled between node (n3) and ground (Gnd or Vss), and the transistor (T8) may be coupled as a gate-grounded NMOS transistor. Transistors (T9, T10) may be coupled as an inverter between the IO voltage (IO_P1) and ground (Gnd or Vss). Also, node (n3) may be coupled to gates of transistors (T9, T10), and node (n4) may be coupled between transistors (T9, T10). In some instances, node (n4) may have a node voltage (Core_P1_DET), which may be referred to of as the core detection signal for the core voltage (Core_P1).

In some implementations, the one or more transistors (T1-T2, ..., T10) may include use of complementary metal-oxide-semiconductor (CMOS) type transistors. For instance, some of the transistors (T1-T2, T5, T7, T8, T9) may include NMOS transistors, and some of the transistors (T3, T4, T6, T10) may include PMOS transistors. However, various other implementations may be used.

Figure 4A:
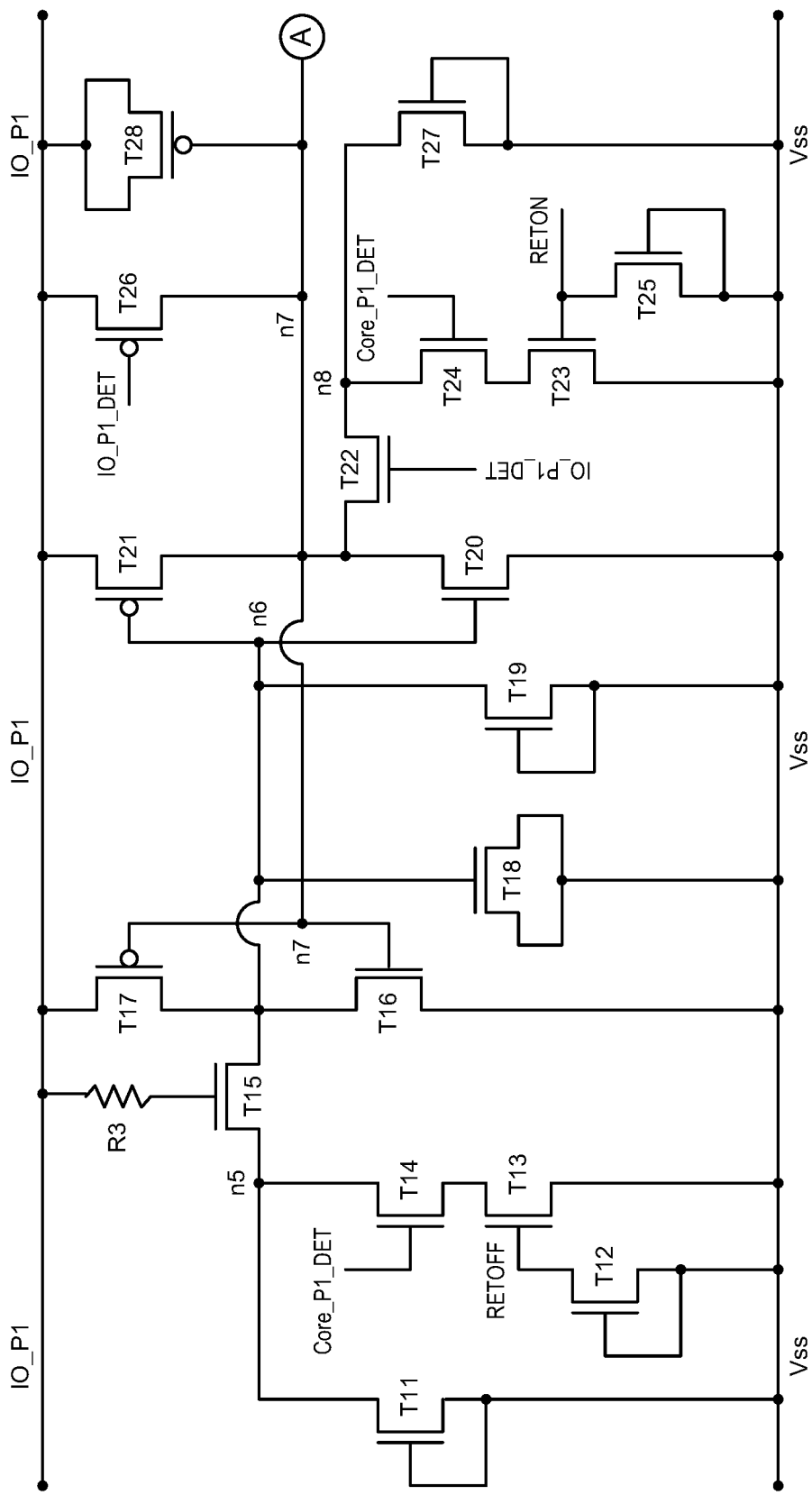
FIGS. 4A-4B illustrate diagrams of core ramp detection circuitry in accordance with various implementations described herein.
Figure 4B:
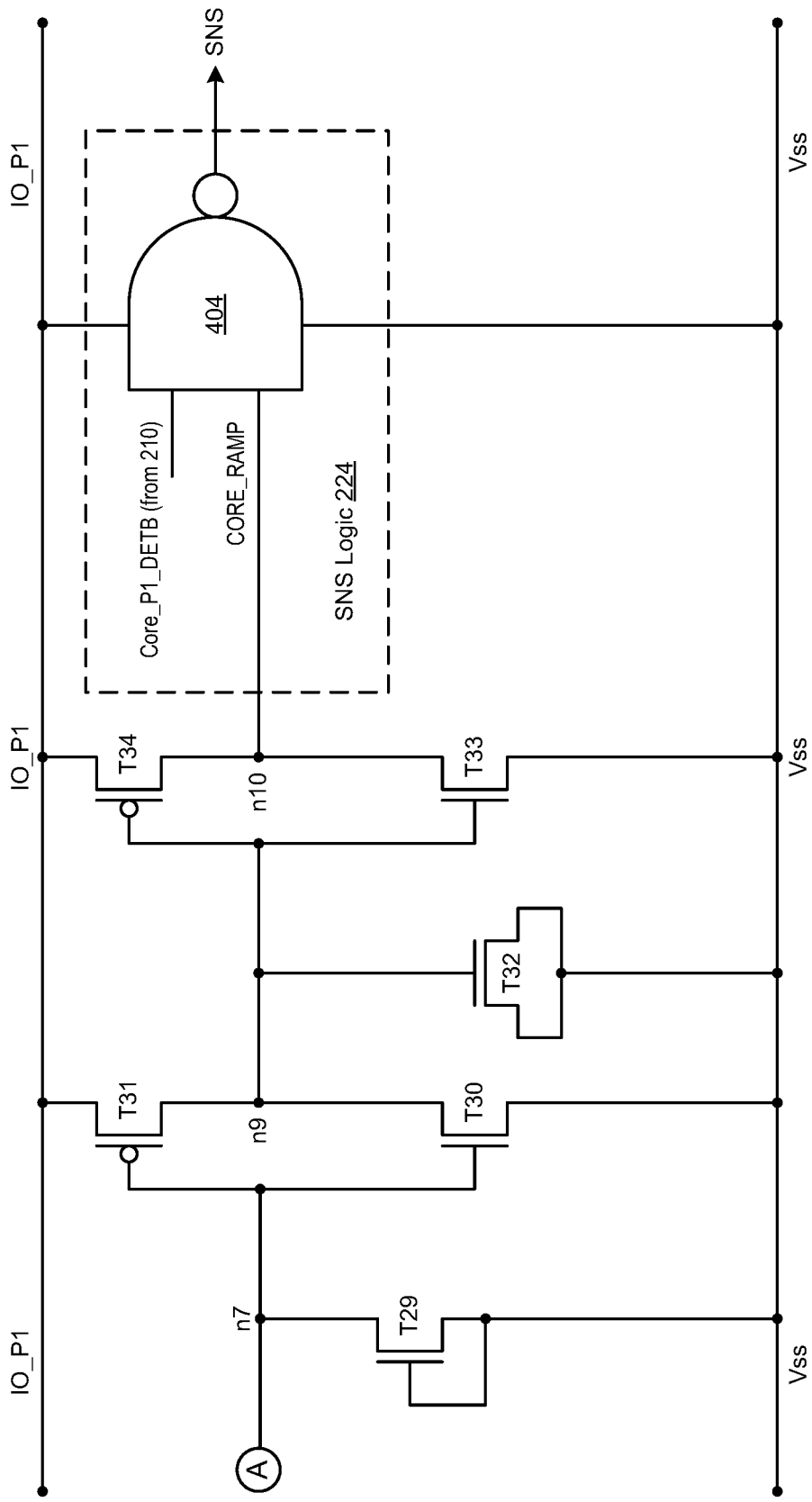

FIGS. 4A-4B illustrate diagrams of core ramp detection circuitry in accordance with various implementations described herein. In particular, FIG. 4A shows a diagram 400A of a first part 212A of the core ramp detection circuitry 212 (of FIG. 2A), and FIG. 4B shows a diagram 400B of a second part 212B of the core ramp detection circuitry 212 (of FIG. 2A) that is coupled to the first part 212A at the encircled element A.

As shown in FIG. 4A, the core detection circuitry 212A may include one or more transistors (T11, T12, ..., T27) and one or more resistors (R3) that are arranged and coupled together to receive input signals (Core_P1_DET, IO_P1_DET, RETON) and provide an output signal at node (n7), which refers to the encircled element A.

In FIG. 4A, transistor (T11) may be coupled between node (n5) and ground (Gnd or Vss), and transistor (T11) may be coupled as a gate-grounded NMOS transistor. Transistor (T15) may be coupled between node (n5) and node (n6), and a resistor (R3) may be coupled between the voltage supply (Vdd) and a gate of transistor (T15). Transistor (T12) may be coupled between a gate of transistor (T13) and ground (Gnd or Vss), and transistor (T12) may be coupled as a gate-grounded NMOS transistor. Also, the RETOFF signal may be coupled to a gate of transistor (T13). Transistors (T13, T14) may be coupled in series between node (n5) and ground (Gnd or Vss). Also, input signal (Core_P1_DET) may be coupled to a gate of transistor (T14). Transistors (T16, T17) may be coupled as an inverter between the voltage supply (Vdd) and ground (Gnd or Vss). Also, node (n7) may be coupled to gates of transistors (T16, T17), and node (n6) may be coupled between transistors (T16, T17). Transistor (T18) may have its source and drain coupled together to ground (Gnd or Vss), and node (n6) may be coupled to a gate of transistor (T18). Transistor (T19) may be coupled between node (n6) and ground (Gnd or Vss), and transistor (T19) may be coupled as a gate-grounded NMOS transistor. Transistors (T20, T21) may be coupled as an inverter between the voltage supply (Vdd) and ground (Gnd or Vss). Also, node (n6) may be coupled to gates of transistors (T20, T21), and node (n7) may be coupled between transistors (T20, T21).

Also, in FIG. 4A, transistor (T22) may be coupled between node (n7) and node (n8), and input signal (IO_P1_DET) may be coupled to a gate of transistor (T22). Transistor (T25) may be coupled between a gate of transistor (T23) and ground (Gnd or Vss), and transistor (T25) may be coupled as a gate-grounded NMOS transistor. Also, in some instances, the input signal (RETON) may be coupled to the gate of transistor (T23). Transistors (T23, T24) may be coupled in series between node (n8) and ground (Gnd or Vss), and input signal (Core_P1_DET) may be coupled to a gate of transistor (T24). Transistor (T27) may be coupled between node (n8) and ground (Gnd or Vss), and transistor (T27) may be coupled as a gate-grounded NMOS transistor. Transistor (T26) may be coupled between the voltage supply (Vdd) and node (n7), and input signal (IO_P1_DET) may be coupled to gate of transistor (T26). Transistor (T28) may have its source and drain coupled together to the voltage supply (Vdd), and node (n7) may be coupled to a gate of transistor (T28). Also, the first part 212A of the core ramp detection circuitry 212 (as shown in FIG. 2A) may be coupled to the second part 212B of the core ramp detection circuitry 212 (as shown in FIG. 2B) at the encircled element A, which refers to node (n7).

In some implementations, the one or more transistors (T11, T12, ..., T28) may include use of CMOS type transistors. For instance, some of the transistors (T11, T12, T13, T14, T15, T16, T18, T19, T20, T22, T23, T24, T25, T27) may include NMOS transistors, and some of the transistors (T17, T21, T26, T28) may include PMOS transistors. However, various other implementations may be used.

In FIG. 4B, transistor (T29) may be coupled between node (n7) and ground (Gnd or Vss), and transistor (T29) may be coupled as a gate-grounded NOS transistor. Transistors (T30, T31) may be coupled as an inverter between the voltage supply (Vdd) and ground (Gnd or Vss). Also, node (n7) may be coupled to gates of transistors (T30, T31), and node (n9) may be coupled between transistors (T30, T31). Transistor (T32) may have its source and drain coupled together to ground (Gnd or Vss), and node (n9) may be coupled to a gate of transistor (T32). Transistors (T33, T34) may be coupled as an inverter between the voltage supply (Vdd) and ground (Gnd or Vss). Also, node (n9) may be coupled to gates of transistors (T33, T34), and node (n10) may be coupled between transistors (T33, T34). In some instances, node (n10) may have a node voltage (CORE_RAMP), which may be referred to as the core ramp signal for the core voltage (Core_P1). Also, in some instances, a logic gate 404 (e.g., NAND gate) may be coupled between the IO voltage (IO_P1) as a power supply input and ground (Gnd or Vss). The logic gate 404 (e.g., NAND gate) may have multiple inputs including a first input that is coupled to the input voltage (Core_P1_DETB) and a second input that is coupled to node (n10). The logic gate 404 (e.g., NAND gate) may provide the core ramp sensing signal (SNS) as an output. In some instances, in reference to FIG. 4B, the logic gate 404 (e.g., NAND gate) may refer to the sense (SNS) logic circuitry 224 in FIG. 2B.

In some implementations, the one or more transistors (T29, T30, ..., T34) may include use of CMOS type transistors. For instance, some of the transistors (T29, T30, T32, T33) may include NMOS transistors, and some of the transistors (T31, T34) may include PMOS transistors. However, various other implementations may be used.

Figure 5A:
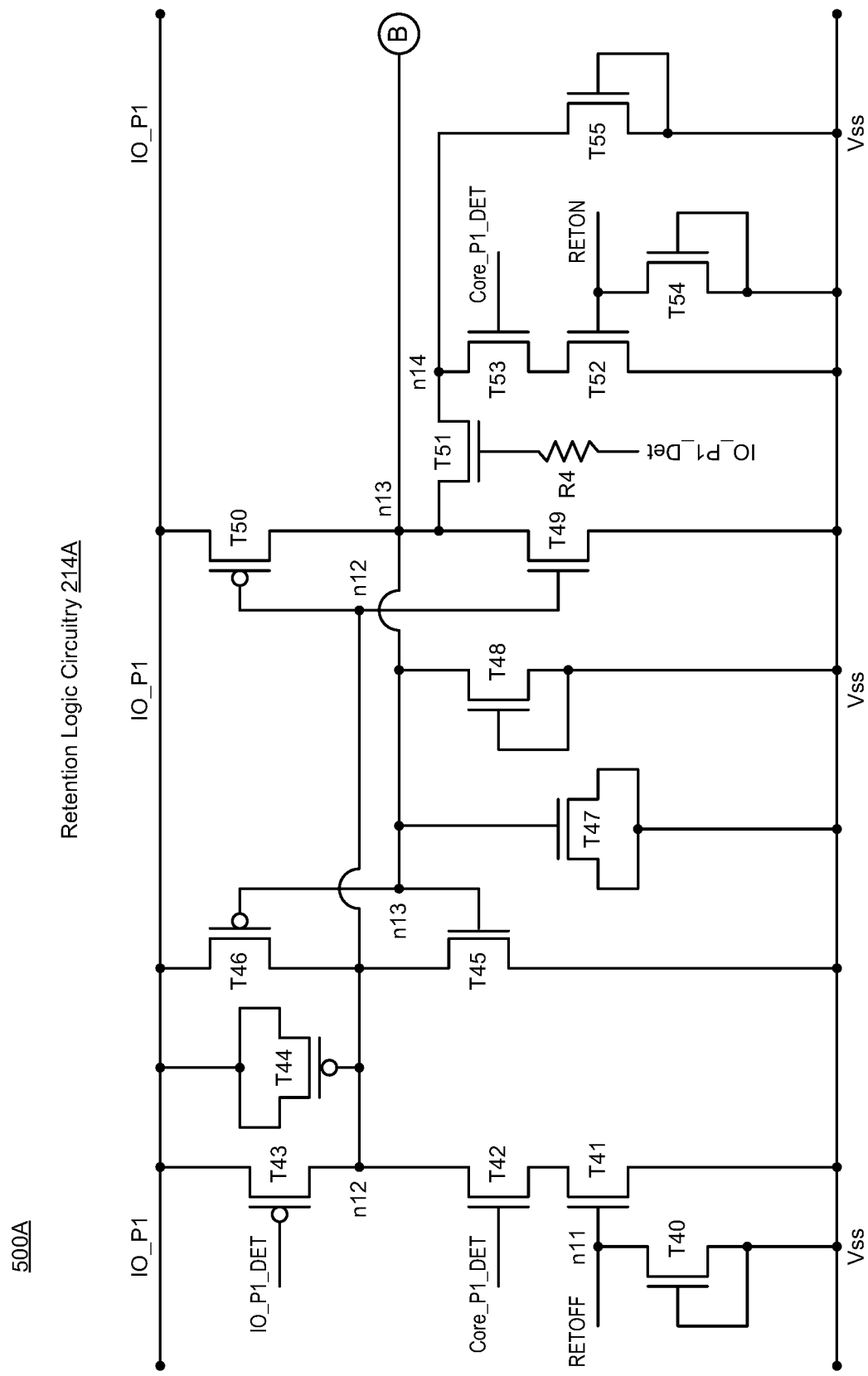
FIGS. 5A-5B illustrate diagrams of retention logic circuitry in accordance with various implementations described herein.
Figure 5B:
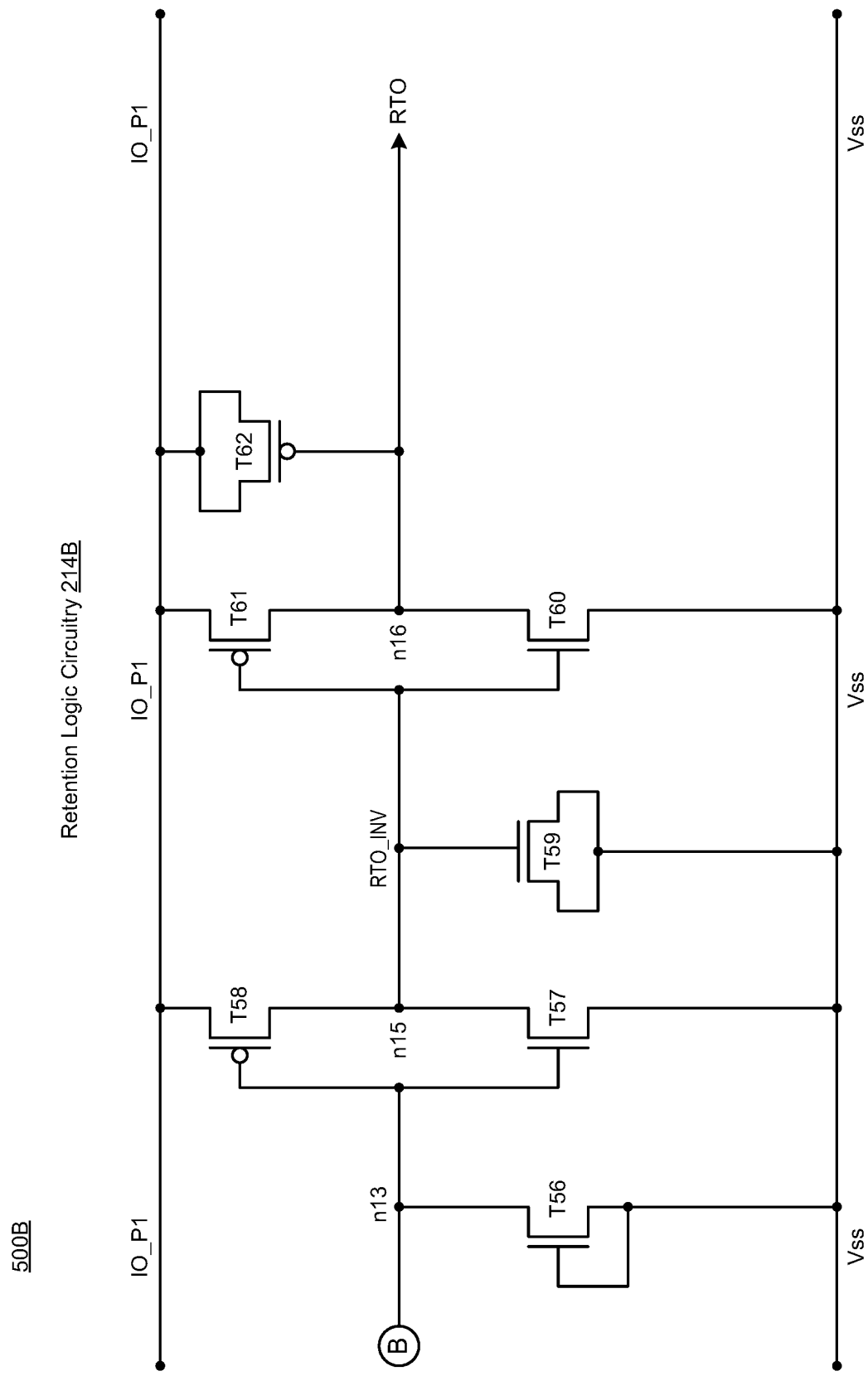

FIGS. 5A-5B illustrate diagrams of retention logic circuitry in accordance with various implementations described herein. In particular, FIG. 5A shows a diagram 500A of a first part 214A of the retention logic circuitry 214 (of FIG. 2A), and FIG. 5B shows a diagram 500B of a second part 214B of the retention logic circuitry 214 (of FIG. 2A) that is coupled to the first part 214A at the encircled element B.

As shown in FIG. 5A, the core ramp detection circuitry 214A may include one or more transistors (T40, T41, ..., T54) and one or more resistors (R4) that are arranged and coupled together to receive input signals (Core_P1_DET, IO_P1_DET, RETON, RETOFF) and provide at least one output signal at node (n13), which may refer to the encircled element B.

In FIG. 5A, transistor (T40) may be coupled between a gate of transistor (T41) at node (n11) and ground (Gnd or Vss), and transistor (T40) may be coupled as a gate-grounded NMOS transistor. Transistors (T41, T42) may be coupled in series between node (n12) and ground (Gnd or Vss). Also, input signal (Core_P1_DET) may be coupled to a gate of transistor (T42), and the input signal (RETOFF) may be coupled to the gate of transistor (T41). Transistor (T43) may be coupled between the voltage supply (Vdd) and node (n12), and the input signal (IO_P1_DET) may be coupled to a gate of transistor (T43). Transistor (T44) may have its source and drain coupled together to the voltage supply (Vdd), and node (n12) may be coupled to a gate of transistor (T44). Transistors (T45, T46) may be coupled as an inverter between the voltage supply (Vdd) and ground (Gnd or Vss). Also, node (n13) may be coupled to gates of transistors (T45, T46), and node (n12) may be coupled between transistors (T45, T46). Transistor (T47) may have its source and drain coupled together to ground (Gnd or Vss), and node (n13) may be coupled to a gate of transistor (T47). Transistor (T48) may be coupled between node (n13) and ground (Gnd or Vss), and transistor (T48) may be coupled as a gate-grounded NMOS transistor. Transistors (T49, T50) may be coupled as an inverter between the voltage supply (Vdd) and ground (Gnd or Vss). Also, node (n12) may be coupled to gates of transistors (T49, T50), and node (n13) may be coupled between transistors (T49, T50).

Also, in FIG. 5A, transistor (T51) may be coupled between node (n13) and node (n14), and input signal (RETON) may be coupled to a gate of transistor (T51) via a resistor (R4). Transistor (T54) may be coupled between a gate of transistor (T52) and ground (Gnd or Vss), and transistor (T54) may be coupled as a gate-grounded NMOS transistor. Also, in some instances, the input signal (RETON) may be coupled to the gate of transistor (T52). Transistors (T52, T53) may be coupled in series between node (n14) and ground (Gnd or Vss), and input signal (Core_P1_DET) may be coupled to a gate of transistor (T53). Transistor (T55) may be coupled between node (n14) and ground (Gnd or Vss), and transistor (T55) may be coupled as a gate-grounded NMOS transistor. Also, the first part 214A of the core ramp detection circuitry 214 (as shown in FIG. 2A) may be coupled to the second part 214B of the core ramp detection circuitry 214 (as shown in FIG. 2B) at the encircled element B, which refers to node (n13).

In some implementations, the one or more transistors (T40, T41, . . . , T55) may include use of CMOS type transistors. For instance, some of the transistors (T40, T41, T42, T45, T47, T48, T49, T51, T52, T53, T54, T55) may include NMOS transistors, and some of the transistors (T43, T44, T46, T50) may include PMOS transistors. However, various other implementations may be used.

In FIG. 5B, transistor (T56) may be coupled between node (n13) and ground (Gnd or Vss), and transistor (T56) may be coupled as a gate-grounded NMOS transistor. Transistors (T57, T58) may be coupled as an inverter between the voltage supply (Vdd) and ground (Gnd or Vss). Also, node (n13) may be coupled to gates of transistors (T57, T58), and node (n15) may be coupled between transistors (T57, T58). Transistor (T59) may have its source and drain coupled together to ground (Gnd or Vss), and node (n15) may be coupled to a gate of transistor (T59). Transistors (T60, T61) may be coupled as an inverter between the voltage supply (Vdd) and ground (Gnd or Vss). Also, node (n15) may be coupled to gates of transistors (T60, T61), and node (n16) may be coupled between transistors (T60, T61). Transistor (T62) may have its source and drain coupled together to the voltage supply (Vdd), and node (n16) may be coupled to a gate of transistor (T62). In some instances, node (n15) provides an inverted output retention signal (RTO_INV), and node (n16) provides the output retention signal (RTO).

In some implementations, the one or more transistors (T56, T57, . . . , T62) may include use of CMOS type transistors. For instance, some of the transistors (T56, T57, T59, T60) may include NMOS transistors, and some of the transistors (T58, T61, T62) may include PMOS transistors. However, various other implementations may be used.

In some implementations, the PVSense cell 108 may incorporate and combine use of multiple circuits associated with the core detection circuitry 210 of FIG. 3, the core ramp detection circuitry 212A, 212B of FIGS. 2A-2B, and the retention logic circuitry 214A, 214B of FIGS. 5A-5B. Thus, in reference to FIGS. 3-5B, the PVSense cell 108 may incorporate the operational characteristics and behavior associated with combination of the circuits 210, 212A, 212B, 214A, 214B, which may operate as follows.

During first core power ramp, Core_P1=0, and hence, Core_P1_DET=0 and Core_P1_DETB=1. As such, SNS may depend on the output of first core ramp detection block 212A, 212B. As Core_P1_DET is '0', the NMOS transistors T14 and T24 are OFF. Therefore, input RETON and RETOFF are disabled and have no control on the output CORE_RAMP. In this condition, when IO_P1 starts ramping-up, then PMOS transistor T28 couples a charge to a right side of the latch provided in first core ramp detection block 212A, 212B. At the same time, the NMOS transistor T11 (which refer to a gate-grounded NMOS that operates like a leakage device) starts discharging a left node of the latch. This operation steers a right branch of the latch to '1', and the left side of the latch is grounded to '0'. Also, CORE_RAMP is set to '1', and SNS is set to '0'.

The retention block 214A, 214B may operate in a similar manner, although some connections are different. For instances, as Core_P1_DET is '0', then the NMOS transistors T42 and T53 are disabled. When IO_P1 starts ramping-up, then extra charge may be coupled to the left side of the latch in the retention block 214A, 214B by the PMOS transistor T44, and the right side may be discharged through the leakage device T55. As a result, the left side of the latch may be steered to '1', and the right side of the latch may be steered to '0'. Also, RTO eventually becomes '0'.

In this instance, SNS=0 and RTO=0 may be transferred to the first IO cell 112 so as to enable the weak pulldown logic in the first IO cell 112, which makes PAD=0. In normal operating conditions, Core_P1=1, and thus, Core_P1_DET becomes '1' and then eventually SNS becomes '1'. SNS may not depend on the first core ramp logic in this condition, or, i.e., when Core_P1 is stable and '1', then the first core ramp detection block 212A, 212B may be disabled. In the retention block 214A, 214B, the NMOS transistors T52 and T41 may be enabled as Core_P1_DET is '1'. Hence, the branches accept inputs RETON and RETOFF and operates as per the values of RETON and RETOFF.

In some implementations, various schemes and techniques described herein provide for substantial power savings during core power-down mode in reference to the IO voltage ring. The various schemes and techniques described herein may be used in many IoT specific applications (e.g., wearable devices, always-on devices, and similar), where power savings is often desirable. The various schemes and techniques described herein allow the core to utilize the pad operational condition in reference to retaining or tri-stating a logical state based on the application. Also, various schemes and techniques described herein resolve the first core ramp retention issue by utilizing additional detection circuitry, wherein the additional detection circuitry is disabled for other core power-down modes, and the additional detection circuitry becomes active in reference to the first core ramping instance. Thus, these schemes and techniques may not need to use extra current, which may preserve the pad operational condition for its use.

Described herein are various implementations of a device. The device may include an output pad that provides an input-output (IO) voltage from an IO power supply. The device may include core ramp detection circuitry that detects a first ramp of a core voltage from a core power supply and provides a core ramp sensing signal. The device may include output logic circuitry that couples the output pad to ground after receiving the core ramp sensing signal so as to reduce leakage of the IO power supply.

Described herein are various implementations of a system. The system may include a first chip having a sensing circuit and a first input/output (IO) cell with a first output pad that provides at least one of an input-output voltage from an IO power supply and a core voltage form a core power supply. The system may include a second chip having a second IO cell with a second output pad that receives at least one of the IO voltage and the core voltage from the first output pad. The sensing circuit may detect a first ramp of the core voltage and couple the first output pad to ground until core supply starts ramping-up for the first time to reduce leakage of at least one of the IO voltage and the core voltage to the second output pad.

Described herein are various implementations of a method. The method may include providing an input-output (IO) voltage via an output pad. The method may include detecting a first ramp of a core voltage. The method may include generating a ramp sensing signal during detection of the first ramp of the core voltage. The method may include coupling the output pad to ground after receiving the ramp sensing signal so as to reduce leakage of at least one of IO voltage and the core voltage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   an output pad that provides an input-output (IO) voltage from an IO power supply;
   core detection circuitry that senses a core voltage from a core power supply and provides a core detection signal;
   core ramp detection circuitry that detects a first ramp of the core voltage from the core power supply and provides a core ramp sensing signal based on the core detection signal; and
   output logic circuitry that couples the output pad directly to ground after receiving the core ramp sensing signal so as to reduce leakage of the IO power supply.

2. The device of claim 1, wherein:
   the core detection circuitry provides the core detection signal to the core ramp detection circuitry, and
   the core ramp detection circuitry receives the core detection signal from the core detection circuitry, receives a retention signal, and provides the core ramp sensing signal to the output logic circuitry based on the core detection signal and the retention signal.

3. The device of claim 2, wherein the core ramp detection circuitry comprises:
core ramp logic circuitry that receives the core detection signal from the core detection circuitry, receives the retention signal, and provides a core ramp signal;
an inverter that receives the core detection signal from the core detection circuitry and provides an inverted core detection signal; and
sense logic circuitry that receives the core ramp signal from the core ramp logic circuitry receives the inverted core detection signal from the inverter, and provides the core ramp sensing signal to the output logic circuitry.

4. The device of claim 2, further comprising:
retention logic circuitry that receives the core detection signal from the core detection circuitry, receives the retention signal, and provides an output retention signal to the output logic circuitry,
wherein the output logic circuitry receives the core ramp sensing signal from the core ramp detection circuitry, receives the output retention signal from the retention logic circuitry, and couples the output pad to ground after receiving the core ramp sensing signal and after receiving the output retention signal to thereby reduce leakage of at least one of the core power supply and the IO power supply.

5. The device of claim 4, wherein during ramp of the core power supply, the output logic circuitry couples the output pad to ground after receiving the core ramp sensing signal in a first logic state and after receiving the output retention signal in a second logic state to thereby reduce leakage of at least one of the core power supply and the IO power supply.

6. The device of claim 5, wherein the output logic circuitry comprises weak pull-down circuitry having a logic gate that receives the core ramp sensing signal from the core ramp detection circuitry, receives the output retention signal from the retention logic circuitry, and provides an activation signal to activate a switch that couples the output pad to ground after receiving the core ramp sensing signal in the first logic state and after receiving the output retention signal in the second logic state.

7. The device of claim 6, wherein the first state refers to a zero logic state, and wherein the second state refers to the zero logic state.

8. The device of claim 1, wherein the output pad comprises a shared structure that is shared by multiple devices.

9. The device of claim 1, further comprising:
a core power supply that provides the core voltage in a core voltage domain.

10. The device of claim 9, further comprising:
an input/output (IO) power supply that provides an IO voltage in an IO voltage domain that is different than the core voltage domain,
wherein the output logic circuitry is coupled to the IO power supply.

11. The device of claim 10, wherein the device inhibits leakage of the core voltage and the IO voltage due to independent power sequencing of the core voltage and the IO voltage in low power applications.

12. A system, comprising:
a first chip having a sensing circuit and a first input/output (IO) cell with a first output pad that provides at least one of an input-output voltage from an IO power supply and a core voltage form a core power supply; and a second chip having a second IO cell with a second output pad that receives at least one of the IO voltage and the core voltage from the first output pad,
wherein the sensing circuit has core ramp detection circuitry that detects a first ramp of the core voltage and provides a core ramp sensing signal, and
wherein the first IO cell has output logic circuitry that directly couples the first output pad to ground after receiving the core ramp sensing signal and until the core voltage starts first time ramping-up to reduce leakage of at least one of the IO voltage and the core voltage to the second output pad.

13. The system of claim 12, wherein the sensing circuit comprises:
core detection circuitry that senses the core voltage and provides a core detection signal to the core ramp detection circuitry,
wherein the core ramp detection circuitry receives the core detection signal from the core ramp detection circuitry, receives a retention signal, and provides the core ramp sensing signal to the output logic circuitry based on the core detection signal and the retention signal.

14. The system of claim 13, wherein the sensing circuit comprises:
retention logic circuitry that receives the core detection signal from the core detection circuitry, receives the retention signal, and provides an output retention signal to the output logic circuitry,
wherein the output logic circuitry receives the core ramp sensing signal from the core ramp detection circuitry, receives the output retention signal from the retention logic circuitry, and couples the output pad to ground after receiving the core ramp sensing signal and after receiving the output retention signal to thereby reduce leakage of at least one of the IO voltage and the core voltage.

15. The system of claim 14, wherein the output logic circuitry comprises:
weak pull-down circuitry having a logic gate that receives the core ramp sensing signal from the core ramp detection circuitry, receives the output retention signal from the retention logic circuitry, and provides an activation signal to activate a switch that couples the first output pad to ground after receiving the core ramp sensing signal in a first logic state and after receiving the output retention signal in a second logic state.

16. The system of claim 15, wherein the first state refers to a zero logic state, and wherein the second state refers to the zero logic state.

17. The system of claim 12, wherein each of the first chip and the second chip comprises:
a core power supply that provides the core voltage in a core voltage domain; and
an IO power supply that provides an IO voltage in an IO voltage domain that is different than the core voltage domain,
wherein the device inhibits leakage of the core voltage and the IO voltage due to independent power sequencing of the core voltage and the IO voltage in low power applications.

18. A method, comprising:
providing an input-output (IO) voltage via an output pad;
receiving a retention signal;
detecting a first ramp of a core voltage;
generating a ramp sensing signal during detection of the first ramp of the core voltage; and coupling the output pad directly to ground after receiving the retention signal and after receiving the ramp sensing signal so as to thereby reduce leakage of at least one of IO voltage and the core voltage.

19. The method of claim 18, further comprising:
coupling the output pad to ground after receiving the ramp sensing signal in a first logic state and after receiving the output retention signal in a second logic state to thereby reduce leakage of at least one of the IO voltage and the core voltage.

20. The method of claim 19, wherein the first state refers to a zero logic state, and wherein the second state refers to the zero logic state.

21. The method of claim 19, further comprising:
generating an activation signal to activate a switch for coupling the output pad to ground after receiving the ramp sensing signal in the logic zero state and after receiving the retention signal in the logic zero state.

\* \* \* \* \*